United States Patent [19]

Farina et al.

[11] 4,163,179

[45] Jul. 31, 1979

[54] CIRCUIT FOR PROVIDING SAW-TOOTH CURRENT IN A COIL

[75] Inventors: Attilio Farina; Giuseppe Zappala, both of Turin, Italy

[73] Assignee: Indesit Industria Elettrodomestici Italiana S.p.A., Turin, Italy

[21] Appl. No.: 895,413

[22] Filed: Apr. 11, 1978

[30] Foreign Application Priority Data

Apr. 29, 1977 [IT] Italy .............................. 67959 A/77

[51] Int. Cl.² .......................... H01J 29/70; H01J 29/76
[52] U.S. Cl. ...................................... 315/408; 315/399
[58] Field of Search ........................ 315/408, 407, 399

[56] References Cited

U.S. PATENT DOCUMENTS

| | | | |
|---|---|---|---|
| 3,365,608 | 1/1968 | Grundmann et al. ............... | 315/408 |
| 3,436,591 | 4/1969 | Grundmann ......................... | 315/408 |
| 3,795,835 | 5/1974 | Aldrich et al. ...................... | 315/408 |
| 3,906,307 | 9/1975 | Van Hattum ........................ | 315/408 |

*Primary Examiner*—Theodore M. Blum
*Attorney, Agent, or Firm*—Ladas, Parry, Von Gehr, Goldsmith & Deschamps

[57] ABSTRACT

A circuit for providing saw-tooth current with a trace and retrace interval in a coil, in particular a deflection coil of a television kinescope, in which the coil is connected to a trace and retrace condenser with which it forms a resonant circuit, is described. In this circuit, a first diode is connected in parallel to the resonant circuit with such polarity that it is made conductive by the saw-tooth current during the first part of the trace interval, and the resonant circuit is also connected, through a second diode, to a controllable switch, which is made conductive at least during that last part of the trace interval, the second diode being connected with such polarity that it is made conductive by the saw-tooth current during the last part of the trace interval. The controllable switch is connected to a supply voltage source through a first inductor and part of the energy stored in the first inductor, during the interval in which the controllable switch is conductive, is transferred, during the retrace interval, to the resonant circuit through a third diode. The main characteristic of this circuit is that means are provided, connected in series to the second diode, the controllable switch, and the first diode, and a first condenser connected in series between the first diode and the second diode, to produce, at least during the conduction interval of the controllable switch, a d.c. voltage with substantially the same amplitude but with opposite polarity to the voltage produced at the terminals of the first condenser.

10 Claims, 5 Drawing Figures

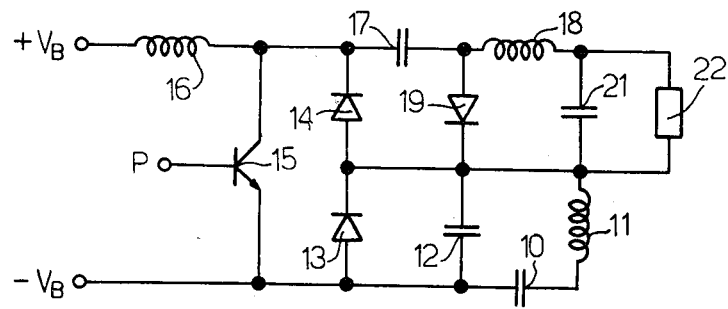
Fig.1
PRIOR ART
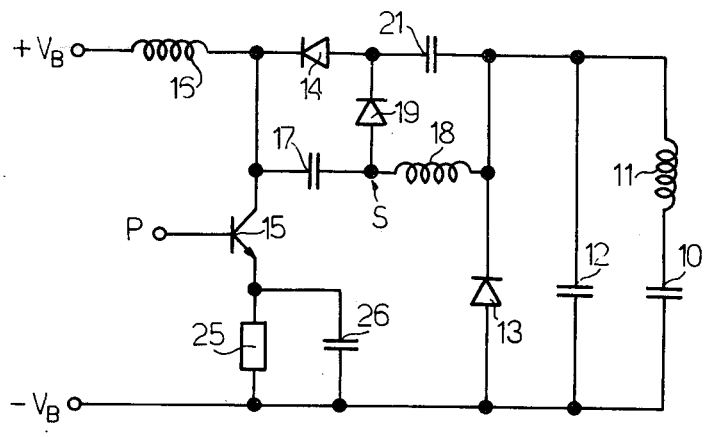
Fig.2-A
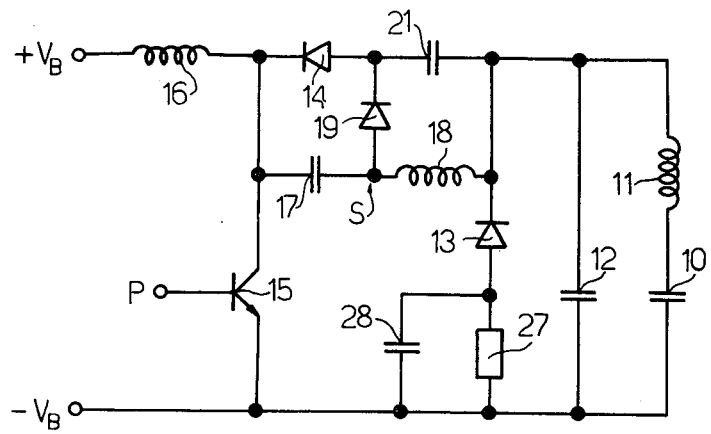
Fig.2-B

CIRCUIT FOR PROVIDING SAW-TOOTH CURRENT IN A COIL

BACKGROUND OF THE INVENTION

The present invention relates to a circuit for providing saw-tooth current with a trace and retrace interval in a coil, in particular, a deflection coil of a television kinescope, in which the said coil is connected to a trace and retrace condenser with which it forms a resonant circuit; in which a first diode is connected in parallel to the said resonant circuit with such polarity that it is made conductive by the saw-tooth current during a first part of the trace interval; in which the said resonant circuit is also connected, through a second diode, to a controllable switch, with a control electrode, connected to a source of periodic signals which make it conductive at least during the last part of the trace interval, the said second diode being connected with such polarity that it is made conductive by the saw-tooth current during the last part of the trace interval; in which the said controllable switch is connected to a supply voltage source through a first inductor and, finally, in which part of the energy stored in the said first inductor, during the interval in which the said controllable switch is conductive, is transferred, during the retrace interval, to the said resonant circuit through a third diode.

A circuit of this type has already been described by A. Farina and G. Zappala (see, for example, FIG. 1 on page 237 of the "Elettronica e Telecomunicazioni" magazine No. 6-1976).

The said known circuit allows obtaining in the deflection coil a saw-tooth current which is able to produce a deflection of the electronic beam in a television kinescope; the amplitude of the current can be easily controlled by varying the conduction time of the transistor which forms the controllable switch, i.e. the length of the positive pulse applied to the base of the transistor.

However, in this known circuit a certain amount of power must be dissipated in the load resistor which, moreover, cannot be connected directly to the negative pole of the supply battery, which makes it difficult for this power to be used.

In the 1976 No. 6 issue of the aforementioned magazine, a number of variations to the circuit are suggested by which one terminal of the load resistor can be connected to the negative pole of the battery, these variations are rather complex, however, (requiring the use of more diodes), i.e. they lead to an increase in the current of the transistor for the same value of current in the deflection coil. Furthermore, the polarity of the voltage which can be obtained at the terminals of the load resistor is the opposite of that of the battery voltage which often poses practical problems, for example, in the case of supplying auxiliary circuits on a television set. Finally, if there are variations in the losses associated with the deflection coil (which occur, for example, on a television set when the beam current is varied if, as is usually the case, the extra-high voltage is obtained from the retrace or flyback pulse), also the voltage at the terminals of the said load resistor varies.

SUMMARY OF THE INVENTION

The aim of the present invention is to provide a solution to at least part of the drawbacks encountered on the above known circuit.

With this aim in view, the present invention relates to a circuit for providing saw-tooth current with a trace and retrace interval in a coil, in particular, a deflection coil of a television kinescope, in which the said coil is connected to a trace and retrace condenser with which it forms a resonant circuit; in which at least a first diode is connected in parallel to the said resonant circuit with such polarity that it is made conductive by the saw-tooth current during the first part of the trace interval; in which the said resonant circuit is also connected, through a second diode, to a controllable switch, with a control electrode, connected to a source of periodic signals which make it conductive at least during a last part of the trace interval, the said second diode being connected with such polarity that it is made conductive by the saw-tooth current during the last part of the trace interval; in which the said controllable switch is connected to a supply voltage source through a first inductor and, finally, in which part of the energy stored in the said first inductor, during the interval in which the said controllable switch is conductive, is transferred, during the retrace interval, to the said resonant circuit through a third diode, wherein means are provided, connected in series to the said second diode, the said controllable switch, the said first diode, and a first condenser connected in series between the said first diode and the said second diode, to produce, at least during the conduction interval of the said controllable switch, a d.c. voltage with substantially the same amplitude but with opposite polarity to the voltage produced at the terminals of the said first condenser.

BRIEF DESCRIPTION OF THE DRAWINGS

Other objects and advantages of the present invention will be apparent from the following detailed description given with reference to the accompanying drawings which have to be considered only as non-limiting examples and in which:

FIG. 1 shows the known circuit of FIG. 1 page 237 of the aforementioned magazine, for providing saw-tooth current in a coil;

FIGS. 2A, 2B and 3 show wiring diagrams of three different circuits for providing saw-tooth current in a coil according to the present invention;

DETAILED DESCRIPTION OF THE INVENTION

Figure 4:
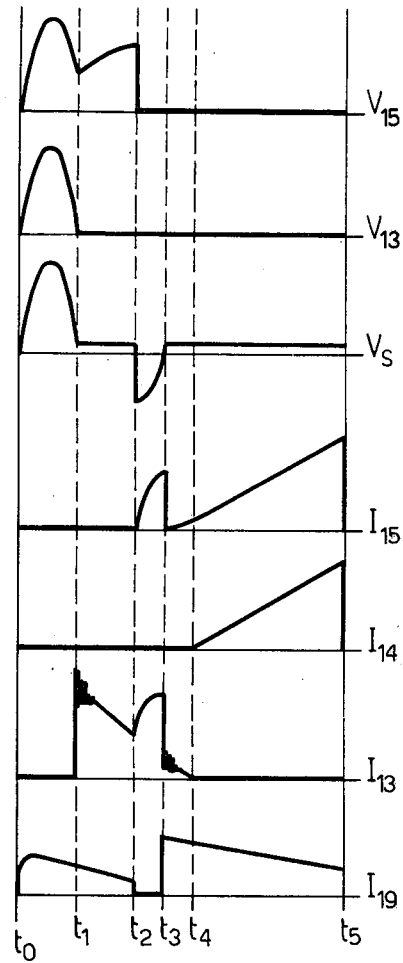
FIG. 4 (not to scale) shows the behaviour of some currents and voltages on the FIG. 3 circuit to show how it operates.

Let us begin with a description of the said known FIG. 1 circuit and a summary of how it operates.

It comprises two terminals $+V_B$ and $-V_B$ having connected thereto the positive and negative poles of a supply battery (not shown), respectively. Connected to terminal $-V_B$ is a terminal of a trace condenser 10 the other terminal of which is connected to one end of a deflection coil 11 which has to be traversed by the saw-tooth current.

Connected between the other end of coil 11 and the terminal $-V_B$ is a retrace condenser 12, in parallel to which a first diode 13 is connected, whose anode is connected to the terminal $-V_B$. The cathode of the said diode 13 is connected to the anode of a second diode 14 whose cathode is connected to the collector of a NPN type transistor 15 which forms a controllable switch inasmuch as a terminal P of the base is connected, in a well known way (not shown), to a periodic signal source which controls its conduction.

The emitter of the said transistor 15 is connected to the $-V_B$ terminal, whilst the collector is connected to the $+V_B$ terminal through a first inductor 16, and, directly, to a terminal of a coupling condenser 17 whose other terminal is connected to a terminal of a second inductor 18 and to the anode of a third diode 19. The cathode of diode 19 is connected to the cathode of diode 13, and the other terminal of the said second inductor 18 is connected to the cathode of diode 19 through a condenser 21 and a load resistor 22 connected in parallel.

The operation of the said known circuit shown in FIG. 1 is as follows.

The resonant circuit consisting of deflection coil 11, retrace condenser 12 and trace condenser 10 oscillates freely during the retrace interval of the flyback as both the transistor 15 and the diodes 13 and 14 are all non-conductive. In this way, a half-wave (half-sinusoid) of positive voltage is produced at the terminals of retrace condenser 12; at the end of this half-wave, the voltage is inverted so that diode 13 is made conductive; the current in coil 11 and diode 13 falls gradually from the maximum it was at the end of the retrace interval to zero.

Before the current reaches zero, transistor 15 is made conductive by means of a control signal to terminal P; the instant transistor 15 becomes conductive, coupling condenser 17 which, as we shall see, has been charged in the meantime, discharges through the network formed by diode 13, condenser 21, inductor 18 and transistor 15.

Condenser 21 has a much greater capacitance than condenser 17 so that the voltage at its terminals can be taken as being constant.

The discharge current of condenser 17 charges inductor 18; the energy thus stored in the said inductor 18 is later supplied by inductor 18 itself to load resistor 22 through diode 19.

When the current in coil 11 reaches zero diode 13 stops conducting; the current in coil 11 inverts and starts to rise gradually flowing into diode 14 and transistor 15.

At the end of the trace interval, transistor 15 is made non-conductive by the control signal applied to point P; in the same instant, diode 14 is also made non-conductive; the current which was circulating in coil 11 flows into condenser 12 to start another retrace interval (corresponding to the half-cycle of free oscillation).

During the period in which transistor 15 was conductive, a gradually increasing current was being made to flow in inductor 16 by the supply battery; the instant transistor 15 is disabled, this current flows through the network formed by condenser 17, diode 19 and condenser 12. It supplies the deflection circuit (formed by coil 11 and condensers 10 and 12) with energy to make up for its losses, and also charges condenser 17, as explained previously.

The cycle is thus repeated.

The energy stored in inductor 16 depends on the conduction time of transistor 15; by varying this time (which can never be longer than the trace interval or shorter than half of it), the energy supplied per cycle to condenser 12 and load resistance 22 is also varied.

The known circuit shown in FIG. 1 has a number of advantages over another known circuit (the so-called Wessel circuit named after the inventor and described in the article IEEE Transactions on Broadcast and Television Receivers, August 1972, Vol. BTR-18 nr. 3, page 177–182): there is no sharp jump in voltage at the terminals of the transistor which constitutes the controllable switch, when it is disabled, there is no need for a transformer, the making of which poses a number of practical problems, for supplying energy to the deflection circuit; finally the circuit itself is much more versatile.

However, it has a number of drawbacks which have already been discussed previously.

Figure 3:
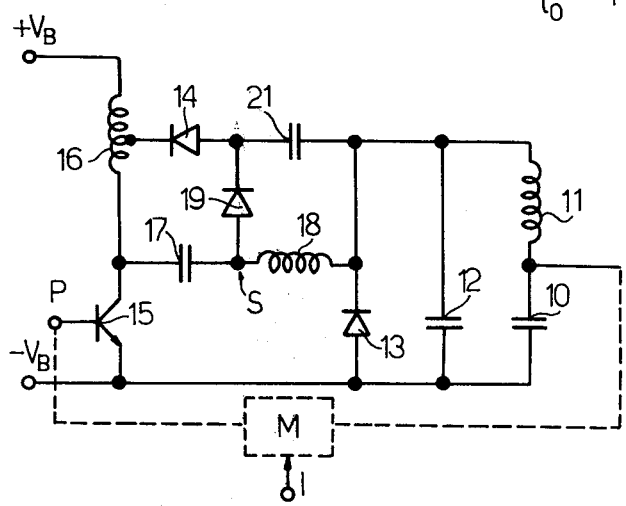

The circuits of FIGS. 2A, 2B and 3, conceived in accordance with the present invention, obviate such drawbacks. In particular, the circuits of FIGS. 2A and 2B may be considered as being derived from that of FIG. 1 with the following modifications:

load resistor 22 has been removed;

the network formed by diode 13, condensers 10 and 12 and deflection coil 11 is connected to the other armature of condenser 21;

addition of load formed by a resistor 25 connected in parallel to condenser 26 (FIG. 2A) between the emitter of transistor 15 and terminal $-V_B$, or formed by a resistor 27 connected in parallel to a condenser 28 (FIG. 2B) between the anode of diode 13 and the $-V_B$ terminal.

The operation of the said circuits shown in FIGS. 2A and 2B is substantially analogous to that described with reference to FIG. 1, but in this way, connected to the terminals of condenser 21 is, instead of resistor 22, the load formed by the series of:

the deflection circuit, formed by diode 13, condensers 10 and 12 and deflection coil 11;

the new load formed by resistor 25 connected in parallel to condenser 26, or by the resistor 27 connected in parallel to condenser 28;

transistor 15;

the circuit formed by diode 14, condenser 17 and diode 19.

On the other hand, the voltage applied to the loop formed by diode 14, transistor 15 and diode 13, when transistor 15 is conductive (voltage at the terminals of condenser 26 or 28) is counterbalanced by the voltage produced at the terminals of condenser 21.

The energy stored in inductor 18 when condenser 17 discharges is subsequently supplied to condenser 21 from which it is picked up by means of diode 14 and transistor 15 and transferred to condenser 26 (or 28).

The advantage of the FIGS. 2A and 2B circuits over the known FIG. 1 circuit is that the resistors for the recovery of a part of the energy picked up from the supply (25, 27) are connected to a pole on the supply battery (terminal $-V_B$).

Another advantage of these circuits is that the polarity of the recovered voltage can be selected (same polarity as the battery in the FIG. 2A circuit; opposite polarity in the FIG. 2B circuit). Recovery can also be made in both ways simultaneously in a same circuit comprising the components 25 and 26 and 27 and 28 so as to supply a load symmetrically with respect to the negative pole on the battery (for example, for supplying the final vertical stage on a television set).

The FIG. 3 circuit differs from the FIG. 2A one in that:

resistor 25 has been done away with condenser 26;

the cathode of diode 14 is connected to an intermediate tap on the winding of inductor 16, near the end connected to the collector of transistor 15.

In this way, the counter-voltage to the condenser 21 voltage, which was represented by the load formed by resistor 25 with condenser 26, is represented by the voltage present in inductor 16, between the cathode of diode 14 and the collector of transistor 15 when the latter is conductive.

The energy which was dissipated in resistor 25 is now sent back into circulation. In fact, when condenser 21 discharges (when diode 14 is conductive), the energy is transferred from condenser 21 to the part of inductor 16 between the cathode of diode 14 and the collector of transistor 15; it is then transferred again, when transistor 15 stops conducting, from inductor 16 to condenser 17 and subsequently, from condenser 17 to inductor 18 and from inductor 18 to condenser 21.

The graphs of FIG. 4 will show more clearly how the FIG. 3 circuit operates.

The first line shows the behaviour of the voltage $V_{15}$ at the terminals of transistor 15; the second line shows the behaviour of the voltage $V_{13}$ at the terminals of diode 13; the third line shows the behaviour of the voltage $V_s$ between point S (anode of diode 19) and the negative pole (terminal $-V_B$) of the supply battery; the fourth line shows the behaviour of the current $I_{15}$ in the collector of transistor 15; the fifth line shows the behaviour of the current $I_{14}$ in diode 14; the sixth line shows the behaviour of the current $I_{13}$ in diode 13; and the seventh line shows the behaviour of the current $I_{19}$ in diode 19.

The time axis is divided into five intervals marked off with six successive instants ($t_0 \ldots t_5$).

$t_0$ marks the end of the trace interval and the start of the retrace interval ($t_0$–$t_1$). At $t_0$, transistor 15 and diode 14 stop conducting and the voltage in the circuit of coil 11 and condensers 10 and 12 starts to oscillate freely; this oscillation can be seen between $t_0$–$t_1$ on the second line of FIG. 4.

The first line shows how the sinusoidal voltage produced at the terminals of diode 13 and condenser 12 is joined, at the terminals of transistor 15, by a more or less gradually increasing voltage (actually a sinusoid section) which is the voltage being charged at the terminals of condenser 17; this voltage continues to rise during the interval $t_1$–$t_2$ which corresponds to the first part of the trace interval. During the interval $t_1$–$t_2$, diode 13 is conductive (sixth line of FIG. 4).

At $t_2$, transistor 15 starts conducting (fourth line of FIG. 4) and condenser 17 discharges (third line of FIG. 4) into inductor 18. At the same time, the current in inductor 16 starts to rise while diode 19 is disabled (seventh line of FIG. 4). By $t_3$, condenser 17 is completely discharged and the current in inductor 18, which reached the maximum level at the same instant $t_3$, starts to fall (inductor 18 discharges into condenser 21).

During the interval $t_3$–$t_4$, the current in diode 13 falls to zero (at $t_4$); diode 14 starts conducting and the current of transistor 15 rises faster (fourth and fifth lines of FIG. 4). The current flowing in diode 14 discharges condenser 21 and increases the charge of inductor 16.

$t_5$ marks the end of the trace interval and the start of a new trace interval and a new cycle; in the same instant, transistor 15 is disabled and, consequently, diode 14 is also made non-conductive. A new voltage oscillation is produced at the terminals of condenser 12.

The current in diode 19 is substantially equal to the current in inductor 18, with the exception of intervals $t_0$–$t_2$ in which the current of inductor 18 is joined by that of condenser 17, and $t_2$–$t_3$ in which the diode 19 is disabled by the voltage of condenser 17 (see the behaviour of the voltage $V_S$ on the third line of FIG. 4).

Whereas on the collector of transistor 15 and the cathode of diode 13 the horizontal voltage segments are practically at zero (with respect to the terminal $-V_B$ corresponding to the negative pole of the battery), at point S as well as on the cathode of inductor 14 and on the cathode of inductor 19, these horizontal voltage segments are positive with respect to the negative voltage of the $-V_B$ terminal as a result of the transformation ratio of the intermediate tap on the winding of inductor 16.

The advantages of the circuit according to the present invention will be clearly seen from the description given.

In particular, the FIG. 3 circuit does not require part of the power picked up from the battery to be dissipated in an auxiliary load, as in the case of the circuits of FIGS. 2A and 2B; this circuit results in being much more versatile and independent.

The FIG. 3 circuit also shows a control loop, drawn with a dotted line, containing a pulse width modulator M (of known type) which samples the voltage value at the terminals of trace condenser 10, and receives the line sync pulses at terminal I and supplies the base of transistor 15 (point P) with pulses of variable lengths so as to keep constant the voltage at the terminals of condenser 10 and, consequently, the amplitude of the saw-tooth current in deflection coil 11.

To those skilled in the art, it will be clear that variations can be made to the circuit described by way of example, without, however, departing from the scope of the principles of novelty of the inventive idea. For example, resistors 25 and 27 symbolize a general load, which can also be an auxiliary circuit, etc. Table of values of the components of the FIG. 3 circuit:

inductor  16:10 mH
condenser 17:27 nF
inductor  18:0.56 mH
condenser 21:220 μF
condenser 12:47 nF
condenser 10:1.8 μF
inductor  11:300 μH

What we claim is:

1. In a circuit for providing saw-tooth current with a trace and retrace interval in a coil, in particular a deflection coil of a television kinescope, in which the said coil is connected to a trace and retrace condenser with which it forms a resonant circuit; in which at least a first diode is connected in parallel to the said resonant circuit with such polarity that it is made conductive by the saw-tooth current during the first part of the trace interval; in which the said resonant circuit is also connected, through a second diode, to a controllable switch, with a control electrode, connected to a source of periodic signals which make it conductive at least during the last part of the trace interval, the said second diode being connected with such polarity that it is made conductive by the saw-tooth current during the last part of the trace interval; in which the said controllable switch is connected to a supply voltage source through a first inductor; and, finally, in which part of the energy stored in the said first inductor, during the interval in which the said controllable switch is conductive, is transferred, during the retrace interval, to the said resonant circuit through a third diode, the improvement wherein means are provided, connected in series to the said second diode, the said controllable switch, the said first diode, and a first condenser connected in series between the said first diode and the said second diode, to produce, at least during the conduction interval of the said controllable switch, a d.c. voltage with substantially the same amplitude but with opposite polarity to the voltage produced at the terminals of the said first condenser.

2. The circuit of claim 1, wherein the said means for producing the said voltage comprise a load arranged between the said controllable switch and a terminal at a reference potential.

3. The circuit of claim 2, in which the said controllable switch is a transistor, wherein the said load is arranged between the emitter of the said transistor and the said terminal.

4. The circuit of claim 1, wherein the said means for producing the said voltage comprise a load arranged between the said first diode and a terminal at a reference potential.

5. The circuit of claim 2, wherein the said load comprises a resistor connected in parallel to a second condenser.

6. The circuit of claim 4, wherein the said load comprises a resistor connected in parallel to a second condenser.

7. The circuit of claim 2, wherein the said terminal is at a negative reference potential determined by the said supply voltage source for the said circuit.

8. The circuit of claim 4, wherein the said terminal is at a negative reference potential determined by the said supply voltage source for the said circuit.

9. The circuit of claim 1, wherein the said means for producing the said voltage comprise a part of the said first inductor, connected between the said second diode and the said controllable switch.

10. The circuit of claim 1, wherein the said first inductor is connected to the said resonant circuit through a second condenser connected at least in series with the said third diode, and a second inductor is connected on one side thereof to the said second condenser and the said third diode and on the other side thereof to the said first diode.

* * * * *